(12) United States Patent
Jin et al.

(10) Patent No.: US 12,376,328 B2
(45) Date of Patent: Jul. 29, 2025

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Jisong Jin, Shanghai (CN); Subhash Kuchanuri, Shanghai (CN); Abraham Yoo, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 82 days.

(21) Appl. No.: 18/120,098

(22) Filed: Mar. 10, 2023

(65) Prior Publication Data
US 2023/0215927 A1    Jul. 6, 2023

Related U.S. Application Data

(62) Division of application No. 17/218,770, filed on Mar. 31, 2021, now Pat. No. 11,626,497.

(30) Foreign Application Priority Data

Nov. 17, 2020    (CN) .......................... 202011289258.X

(51) Int. Cl.
*H10D 84/01*    (2025.01)
*H01L 23/528*    (2006.01)
(Continued)

(52) U.S. Cl.
CPC ..... *H10D 30/6219* (2025.01); *H01L 23/5286* (2013.01); *H01L 23/535* (2013.01);
(Continued)

(58) Field of Classification Search
CPC ....... H01L 29/41791; H01L 21/823871; H01L 23/5286; H01L 23/535; H01L 29/401;
(Continued)

(56) References Cited

U.S. PATENT DOCUMENTS

| 2017/0148797 | A1* | 5/2017 | Kim | ..................... H10D 30/024 |
| 2021/0028112 | A1* | 1/2021 | Kim | .................. H01L 29/41791 |
| 2021/0098306 | A1* | 4/2021 | Smith | ............. H01L 21/823475 |

* cited by examiner

*Primary Examiner* — Moin M Rahman
(74) *Attorney, Agent, or Firm* — Crowell & Moring LLP

(57) ABSTRACT

A semiconductor structure is provided. The semiconductor structure includes: a substrate; discrete channel structures on the substrate in device regions; a power rail line, located in the substrate of a power rail region; a gate structure, extending across the channel structures; source/drain doped regions, located in the channel structures on two sides of the gate structure; an interlayer dielectric layer, located at a side portion of the gate structure; a power rail contact plug, penetrating a partial thickness of the interlayer dielectric layer at a top of the power rail line, the power rail contact plug is in full contact with a top surface of the power rail line in a longitudinal direction; and a source/drain contact layer, located in the interlayer dielectric layer and in contact with the source/drain doped region, on a projection surface parallel to the substrate, the source/drain contact layer extends across the power rail line.

6 Claims, 9 Drawing Sheets

(51) Int. Cl.
*H01L 23/535* (2006.01)
*H10D 30/62* (2025.01)
*H10D 64/01* (2025.01)
*H10D 84/03* (2025.01)

(52) U.S. Cl.
CPC ......... *H10D 64/01* (2025.01); *H10D 84/0186* (2025.01); *H10D 84/038* (2025.01)

(58) Field of Classification Search
CPC ........... H01L 21/823878; H01L 29/775; H01L 21/823821; H01L 27/0924; H01L 21/76883; H01L 21/76895; H01L 23/485; H01L 23/481; H01L 21/76805; H01L 21/823431; H01L 21/823475; H01L 23/528; H01L 23/5283; H01L 27/0886; H01L 29/66545; H01L 21/76846; H01L 21/76849; H01L 29/7845; H01L 21/76834; H01L 21/76801; H01L 21/0337; H01L 21/28247; H01L 21/28568; H01L 21/3086; H01L 21/31105; H01L 21/31144; H01L 21/76224; H01L 21/823481; H01L 21/823807; H01L 21/823814; H01L 21/823842; H01L 21/823857; H01L 23/53266; H01L 27/1104; H01L 28/24; H01L 29/0847; H01L 29/516; H01L 29/6653; H01L 29/7854; H01L 21/28518; H01L 23/5329; H01L 27/0207; H01L 28/20; H01L 29/41783; H01L 21/02532; H01L 21/02636; H01L 21/76802; H01L 21/76877; H01L 21/823828; H01L 27/0922; H01L 29/167; H01L 29/66636; H01L 29/7851; H01L 29/66795; H01L 29/7846; H01L 29/785; H01L 29/165; H01L 21/76897; H01L 23/5226; H01L 23/53209; H01L 23/53238; H01L 21/76816; H01L 29/0649; H01L 29/66818; H01L 29/7848; H01L 29/7843; H01L 21/76232; H01L 29/6656; H01L 29/0653; H01L 21/76885; H01L 29/665; H01L 21/02164; H01L 21/0217; H01L 21/0332; H01L 21/823437; H01L 24/16; H01L 29/7842; H01L 29/7853; H01L 2224/16227; H01L 24/32; H01L 24/73; H01L 2224/32225; H01L 2224/73204; B82Y 10/00; H10D 84/0165–0195; H10D 84/85–859; H10D 84/907–994; H10D 84/0193; H10D 84/853; H10D 30/62–6219; H10D 30/024–0245; H10D 84/0158; H10D 86/011; H10D 84/834; H10D 86/215; H10D 30/6728; H10D 30/6733; H10D 30/6735; H10D 62/118; H10D 89/931; H10D 64/252; H10D 84/0188; H10D 84/201; H10D 18/60; H10D 64/01; H10D 84/0186; H10D 84/038; H10D 30/43; H10D 84/0149; H10D 30/60–798; H10D 30/021–0415; H10D 84/83–859; H10D 62/364; H10D 84/0128; H10D 84/0167; H10D 62/85–854; H10D 30/751; H10D 30/027–0278; H10D 30/63; H10D 84/016; H10D 30/501–509; B81C 2203/0728; B81C 2203/0735; B81C 2203/0742; H10B 12/36; H10B 12/056; H10B 63/34; H02K 15/027; A23B 2/783; A45C 11/003; A61K 40/4218; H10F 77/955; H10H 20/826
See application file for complete search history.

SEMICONDUCTOR STRUCTURE AND FORMING METHOD THEREOF

RELATED APPLICATIONS

The present application is a divisional of U.S. patent application Ser. No. 17/218,770, filed Mar. 31, 2021 (still pending), which claims priority to Chinese Patent Appln. No. 202011289258.X, filed Nov. 17, 2020, the entire disclosure of each of which is hereby incorporated by reference.

BACKGROUND

Technical Field

Embodiments and implementations of the present disclosure relate to the field of semiconductor manufacturing, and in particular, to a semiconductor structure and a forming method thereof.

Related Art

A logic chip is formed by standard cells. A size of a standard cell depends on a metal pitch (MP), a height of the standard cell, a polysilicon pitch (PP), and whether a single diffusion barrier (SDB) or a double diffusion barrier (DDB) is used. For many years, chip scaling has been driven by MP scaling and PP scaling. However, the MP scaling is facing the challenges of a photolithography process limitation and an increased resistance, and due to device problems, the PP scaling has slowed down. With the introduction of design technology co-optimization (DTCO), the compression of the height of the standard cell becomes a major scaling option. As the height of the cell gradually decreases, a quantity of fins of a single device in each cell also gradually decreases, which in turn leads to a decrease in a drive current.

A width of a power rail (VDD and VSS) of the standard cell is usually weighted into the value of the MP. The power rail provides power to different components of the chip, and is generally provided by a metal layer in a back end of line (BEOL) process. However, the power rail occupies more space.

To meet the requirements of continuous scaling of a logic chip, when an MP is very small, a current method for optimizing a power supply capability is to move the power rail downward into a base to form a buried power rail (BPR).

In a BPR structure, the power rail is buried in a substrate and is deep into a shallow trench isolation (STI) module, which is beneficial to releasing wiring resources that are interconnected. Moreover, the BPR provides a relatively low resistance and local current distribution for a technology of scaling a pitch to increase a BEOL resistance. In addition, the BPR is also beneficial to reducing the impact of wiring congestion and resistance degradation on the grid-like distribution of VDD, VSS, word lines and bit lines, and improving a write margin and a read speed.

However, the performance of a device is still to be improved at present.

SUMMARY

A problem to be addressed by embodiments and implementations of the present disclosure is to provide a semiconductor structure and a forming method thereof, which is beneficial to reducing a resistance of a power rail contact plug and a contact resistance between a power rail line and the power rail contact plug, thereby optimizing the performance of the semiconductor structure.

To address the foregoing problem, the present disclosure provides a semiconductor structure. In one form, a semiconductor structures includes: a substrate, including a plurality of discrete device regions and a power rail region located between the device regions of the plurality of discrete device regions; discrete channel structures on the substrate in the device regions of the plurality of discrete device regions; a power rail line, located in the substrate in the power rail region, where both the power rail line and the channel structures extend in a transverse direction, and a direction perpendicular to the transverse direction is a longitudinal direction; a gate structure, located on the substrate and extending across the channel structures; source/drain doped regions, located in the channel structures on two sides of the gate structures; an interlayer dielectric layer, located at a side portion of the gate structures and covering the source/drain doped region and the power rail line; a power rail contact plug, penetrating a partial thickness of the interlayer dielectric layer at a top of the power rail line, where the power rail contact plug is in full contact with a top surface of the power rail line in the longitudinal direction; and a source/drain contact layer, located in the interlayer dielectric layer at a top of the source/drain doped region and in contact with the source/drain doped region, where the source/drain contact layer is located on the power rail contact plug and covers a top surface of the power rail contact plug, and on a projection surface parallel to the substrate, the source/drain contact layer extends across the power rail line.

The present disclosure further provides a forming method of a semiconductor structure. In one form, a forming method of a semiconductor structure includes: providing a substrate, where the substrate includes a plurality of discrete device regions and a power rail region located between the device regions, forming discrete channel structures on the substrate in the device regions, forming a power rail line in the substrate in the power rail region, where both the power rail line and the channel structure extend in a transverse direction, and a direction perpendicular to the transverse direction is a longitudinal direction, forming a gate structure extending across the channel structure on the substrate, forming source/drain doped regions in the channel structures on two sides of the gate structure, and forming an interlayer dielectric layer covering the source/drain doped region and the power rail line at a side portion of the gate structure; forming an interconnection groove penetrating the interlayer dielectric layer at a top of the source/drain doped region and a conductive via located at a bottom of the interconnection groove and penetrating the interlayer dielectric layer at a top of the power rail line, where on a projection surface parallel to the substrate, the interconnection groove extends across the power rail line, and a bottom of the conductive via exposes an entire top surface of the power rail line in the longitudinal direction; and filling the conductive via and the interconnection groove, and forming a power rail contact plug filled in the conductive via and a source/drain contact layer filled in the interconnection groove, where the power rail contact plug is in full contact with the top surface of the power rail line in the longitudinal direction, and the source/drain contact layer is in contact with the source/drain doped region.

Compared with the prior art, technical solutions of embodiments and implementations of the present disclosure have at least the following advantages.

In a semiconductor structure provided in embodiments and implementations of the present disclosure, the power rail contact plug penetrates the partial thickness of the interlayer dielectric layer at the top of the power rail line, and the power rail contact plug is in full contact with the top surface of the power rail line in the longitudinal direction. Compared with a case that the power rail contact plug is only in contact with a part of the top surface of the power rail line in the longitudinal direction, in embodiments and implementations of the present disclosure, a dimension of the power rail contact plug in the longitudinal direction and a contact area between the power rail contact plug and the power rail line are increased, to further help to reduce a resistance of the power rail contact plug and a contact resistance between the power rail line and the power rail contact plug, thereby optimizing the performance of the semiconductor structure.

In some implementations, a semiconductor structure further includes: a division layer, penetrating a source/drain contact layer located between the power rail contact plug and an adjacent channel structure, where the division layer divides the source/drain contact layer in the longitudinal direction. With the division layer, based on design requirements, the source/drain contact layer is disconnected from the power rail contact plug that does not need to be electrically connected. In addition, in embodiments and implementations of the present disclosure, a dimension and a position of the division layer can further be adjusted to adjust a distance between the division layer and the power rail contact plug, so that the source/drain contact layer connected to the power rail contact plug further extends to the other side of the power rail contact plug, to further help to increase volumes of the power rail contact plug and the connected source/drain contact layer, and correspondingly reduce resistances of the power rail contact plug and the source/drain contact layer, thereby improving the performance of the semiconductor structure.

In implementations of a forming method of a semiconductor structure provided in the present disclosure, the interconnection groove and the conductive via located at the bottom of the interconnection groove and penetrating the interlayer dielectric layer located at the top of the power rail line are formed, on the projection surface parallel to the substrate, the interconnection groove extends across the power rail line, and the bottom of the conductive via exposes the entire top surface of the power rail line in the longitudinal direction. Compared with a case that the conductive via only exposes a part of the top surface of the power rail line in the longitudinal direction, in embodiments and implementations of the present disclosure, a dimension of the power rail line exposed by the conductive via and a dimension of an opening of the conductive via are increased. Therefore, in the step of forming the power rail contact plug filled in the conductive via, a dimension of the power rail contact plug in the longitudinal direction and a contact area between the power rail contact plug and the power rail line are increased, to further help to reduce a resistance of the power rail contact plug and a contact resistance between the power rail line and the power rail contact plug, thereby optimizing the performance of the semiconductor structure.

In addition, in the forming method of a semiconductor structure provided in embodiments and implementations of the present disclosure, the interconnection groove and the conductive via in communication with each other are first formed, so that the power rail contact plug filled in the conductive via and the source/drain contact layer filled in the interconnection groove are formed by using a filling process in the same step. The power rail contact plug and the source/drain contact layer are an integrated structure correspondingly, to help to reduce a contact resistance between the power rail contact plug and the source/drain contact layer, thereby improving the performance of the semiconductor structure.

In some implementations, the forming method of a semiconductor structure further includes: forming a division layer penetrating the source/drain contact layer located between the power rail contact plug and an adjacent channel structure after the source/drain contact layer and the power rail contact plug are formed, where the division layer divides the source/drain contact layer in the longitudinal direction; or in the step of forming the interconnection groove and the conductive via, forming a division layer located between the conductive via and an adjacent channel structure at the bottom of the interconnection groove, where the division layer protrudes from the bottom of the interconnection groove and divides the interconnection groove in the longitudinal direction. With the division layer, based on design requirements, the source/drain contact layer is disconnected from the power rail contact plug that does not need to be electrically connected. In addition, in embodiments and implementations of the present disclosure, a dimension and a position of the division layer can further be adjusted to adjust a distance between the division layer and the power rail contact plug, so that the source/drain contact layer connected to the power rail contact plug further extends to the interlayer dielectric layer located on the other side of the power rail contact plug, to further help to increase volumes of the power rail contact plug and the connected source/drain contact layer, and correspondingly reduce resistances of the power rail contact plug and the source/drain contact layer, thereby improving the performance of the semiconductor structure.

DETAILED DESCRIPTION

Figure 1:
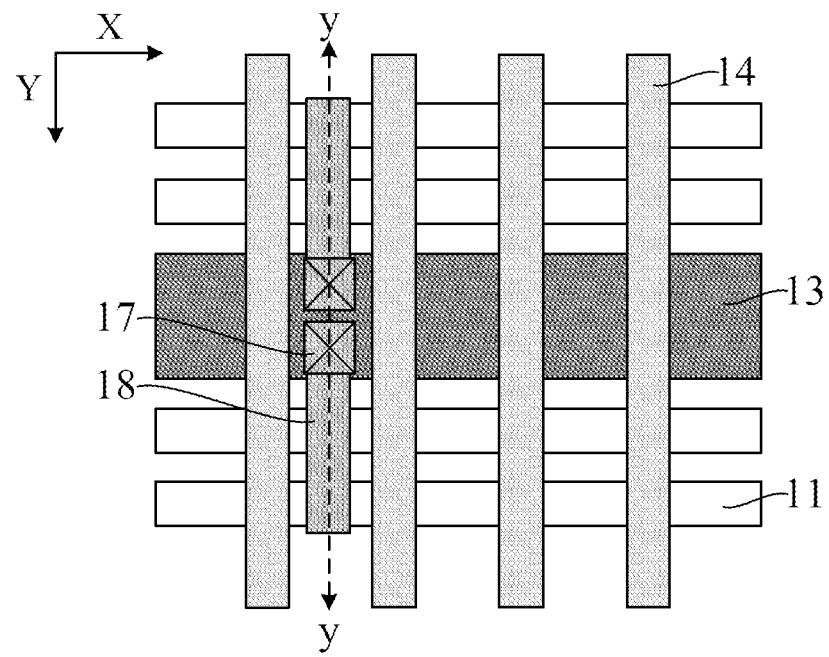
FIG. 1 and FIG. 2 are schematic structural diagrams of a semiconductor structure.
Figure 2:
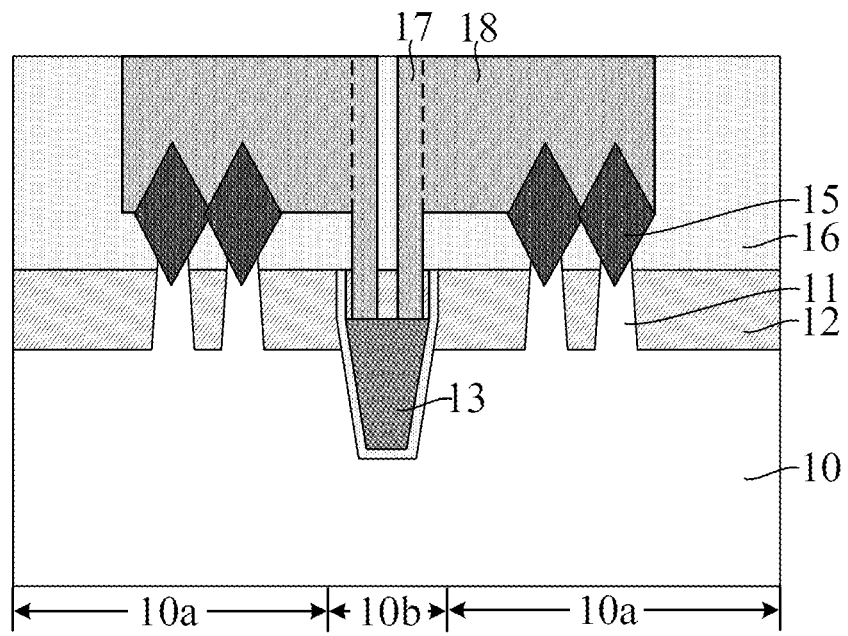

From the background, one of skill in the art will appreciate that a performance of a semiconductor device can be improved. A semiconductor structure is now combined to analyze the reasons why the performance of the device is still to be improved. FIG. 1 and FIG. 2 are schematic structural diagrams of a semiconductor structure. FIG. 1 is a top view, and FIG. 2 is a cross-sectional view of FIG. 1 in a y-y direction.

As shown in FIG. 1 and FIG. 2, the semiconductor structure includes: a substrate 10, including device regions 10a and a power rail region 10b; discrete fins 11 on the substrate 10 in the device regions 10a; an isolation structure 12, located on the substrate 10 exposed by the fin 11, where a top surface of the isolation structure 12 is lower than a top surface of the fin 11; a power rail line 13, located in the substrate 10 in the power rail region 10b and the isolation structure 12, where both the power rail line 13 and the fin 11 extend in a transverse direction (as shown by an X direction in FIG. 1), and a direction perpendicular to the transverse direction is a longitudinal direction (as shown by a Y direction in FIG. 1); a gate structure 14, located on the isolation structure 12 and extending across the fin 11; source/drain doped regions 15, located in the fins 11 on two sides of the gate structure 14; an interlayer dielectric layer 16, located on the isolation structure 12 at a side portion of the gate structure 14 and covering the source/drain doped region 15; a power rail contact plug 17, penetrating the interlayer dielectric layer 16 above the power rail line 13 and in contact with a part of a top surface of the power rail line 13; and a source/drain contact layer 18, penetrating the interlayer dielectric layer 16 above the source/drain doped region 15, where the source/drain contact layer 18 is in contact with the power rail contact plug 17 in the longitudinal direction.

The power rail contact plug 17 is configured to implement an electrical connection between the power rail line 13 and an external circuit or other interconnection structures.

However, the power rail contact plug 17 is only in contact with the part of the top surface of the power rail line 13, a contact area between the power rail contact plug 17 and the power rail line 13 is relatively small, and as a dimension of a device gradually becomes smaller, a critical dimension (CD) of the power rail contact plug 17 gradually decreases. In addition, because the power rail line 13 is buried in the substrate 10 and the isolation structure 12, to enable the power rail contact plug 17 to be in contact with the isolation structure 12, a depth of the power rail contact plug 17 is also relatively large, resulting in a larger depth-to-width ratio of the power rail contact plug 17, a relatively high resistance of the power rail contact plug 17, a relatively large contact resistance between the power rail contact plug 17 and the power rail line 13, and poor performance of a formed device.

To address the technical problem, embodiments and implementations of the present disclosure provide a semiconductor structure, including a power rail contact plug, where the power rail contact plug penetrates a partial thickness of an interlayer dielectric layer at a top of the power rail line, and the power rail contact plug is in full contact with a top surface of the power rail line in the longitudinal direction. Compared with a case that the power rail contact plug is only in contact with a part of the top surface of the power rail line in the longitudinal direction, in embodiments and implementations of the present disclosure, a dimension of the power rail contact plug in the longitudinal direction and a contact area between the power rail contact plug and the power rail line are increased, to further help to reduce a resistance of the power rail contact plug and a contact resistance between the power rail line and the power rail contact plug, thereby optimizing the performance of the semiconductor structure.

Figure 3:
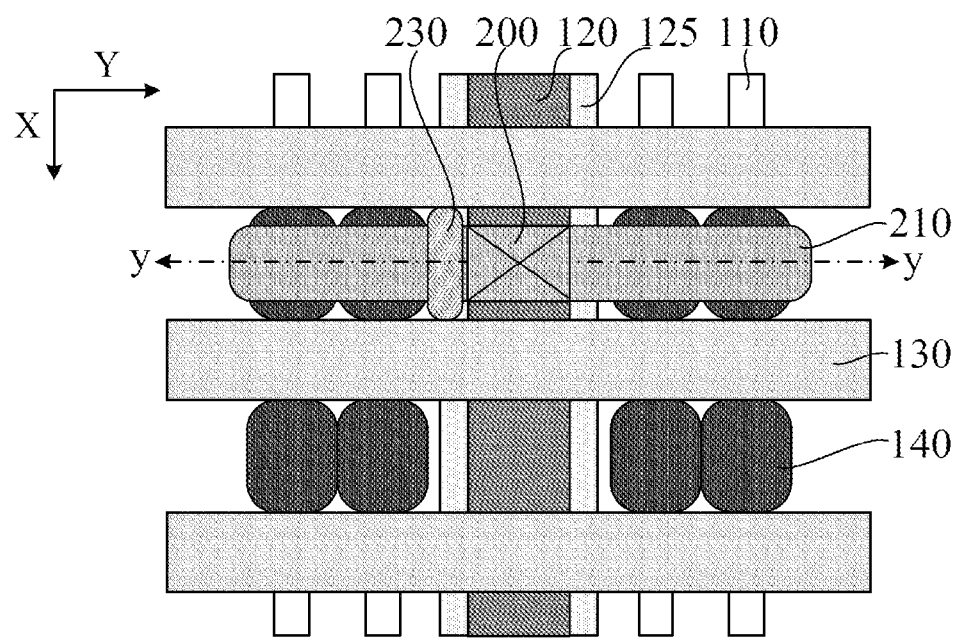
FIG. 3 and FIG. 4 are schematic structural diagrams of one form of a semiconductor structure according to the present disclosure.
Figure 4:
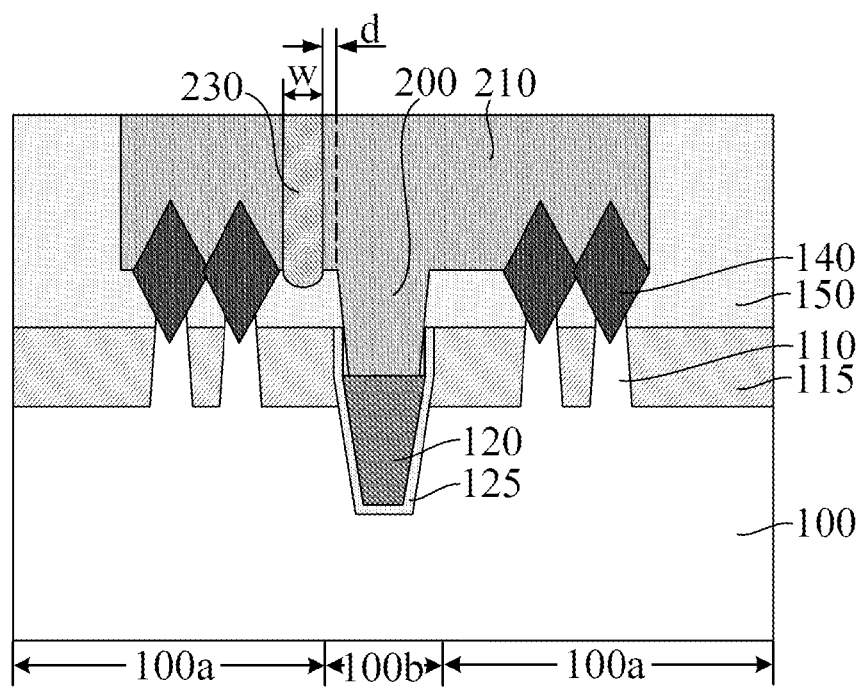

To make the foregoing objectives, features, and advantages of embodiments and implementations of the present disclosure more clearly understood, specific embodiments and implementations of the present disclosure are described in detail below with reference to the accompanying drawings. Referring to FIG. 3 and FIG. 4, FIG. 3 is a top view, and FIG. 4 is a cross-sectional view of FIG. 3 in a y-y direction and shows a schematic structural diagram of one form of a semiconductor structure according to the present disclosure.

As shown in FIG. 3 and FIG. 4, in this form, the semiconductor structure includes: a substrate 100, including a plurality of discrete device regions 100a and a power rail region 100b located between the device regions 100a; discrete channel structures 110 on the substrate 100 in the device regions 100a; a power rail line 120, located in the substrate 100 in the power rail region 100b, where both the power rail line 120 and the channel structure 110 extend in a transverse direction (as shown by an X direction in FIG. 3), and a direction perpendicular to the transverse direction is a longitudinal direction (as shown by a Y direction in FIG. 3); a gate structure 130, located on the substrate 100 and extending across the channel structure 110; source/drain doped regions 140, located in the channel structures 110 on two sides of the gate structure 130; an interlayer dielectric layer 150, located at a side portion of the gate structure 130 and covering the source/drain doped region 140 and the power rail line 120; a power rail contact plug 200, penetrating a partial thickness of the interlayer dielectric layer 150 at a top of the power rail line 120, where the power rail contact plug 200 is in full contact with a top surface of the power rail line 120 in the longitudinal direction; and a source/drain contact layer 210, located in the interlayer dielectric layer 150 at a top of the source/drain doped region 140 and in contact with the source/drain doped region 140, where the source/drain contact layer 210 is located on the power rail contact plug 200 and covers a top surface of the power rail contact plug 200, and on a projection surface parallel to the substrate 100, the source/drain contact layer 210 extends across the power rail line 120.

The substrate 100 is configured to provide a process platform for forming a semiconductor structure. In this form, the substrate 100 is a silicon substrate. In another form, a material of the substrate may be alternatively germanium, silicon germanium, silicon carbide, gallium arsenide, indium gallium, or another material suitable for process requirements or easy to integrate.

The device region 100a is used for forming a field effect transistor (FET), for example, one or two of a PMOS transistor and an NMOS transistor. The power rail region 100b is used for arranging the power rail line 120.

When the device is working, the channel structure 110 is configured to provide a conductive channel of the FET. In this form, there are a plurality of channel structures 110, and the plurality of channel structures 110 are arranged in parallel at intervals. In an example, the channel structure 110 is a fin. Correspondingly, the device region 100a is used for forming a fin field effect transistor (FinFET). In this form, a material of the fin is the same as the material of the substrate 100, and the material of the fin is silicon. In another form, the material of the fin may be alternatively a semiconductor material suitable for forming a fin, such as germanium, silicon germanium, silicon carbide, gallium arsenide, or indium gallium, and the material of the fin may be alternatively different from the material of the substrate.

In some other forms, the channel structure may be alternatively a channel structure layer spaced apart from the substrate, the channel structure layer includes one or more spaced channel layers, and the gate structure covers a part of a top of the channel structure and surrounds the channel layer. Correspondingly, the device region is used for forming a gate-all-around (GAA) transistor or a forksheet transistor.

In this form, the semiconductor structure further includes an isolation structure 115, located on the substrate 100 and covering a part of a side wall of the channel structure 110. A top surface of the isolation structure 115 is lower than a top surface of the channel structure 110.

The isolation structure 115 is configured to isolate adjacent channel structures 110, and the isolation structure 115 is further configured to isolate the substrate 100 from the gate structure 130. In this form, the channel structure 110 is a fin, a part, exposed from the isolation structure 115, of the fin is used as an active fin, and the active fin is configured to provide a conductive channel for operation of the device.

In this form, the isolation structure 115 is an STI structure, and a material of the isolation structure 115 is an insulation material such as one or more of silicon oxide, silicon oxynitride, and silicon nitride.

In this form, the power rail line 120 is configured to provide power to different components of a chip. In this form, the power rail line 120 is located in the substrate 100 in the power rail region 100b, and the power rail line 120 is a BPR, which is beneficial to releasing wiring resources that are interconnected in a BEOL and reducing a height of a standard cell, to meet a requirement of continuous scaling of a logic chip. In addition, the BPR uses a technology of scaling a pitch and increasing a BEOL resistance, which is also beneficial to providing a relatively low resistance and local current distribution.

The power rail line 120 is a long-strip-shaped structure, the power rail line 120 is parallel to an extending direction of the channel structure 110, and there is an interval between the power rail line 120 and the channel structure 110.

A material of the power rail line 120 is a conductive material. In this form, the material of the power rail line 120 is a metal material such as one or more of Co, W, Ni, and Ru. The power rail line 120 has a relatively low resistivity through selection of these materials, which is beneficial to alleviating RC delay and improving a processing speed of a chip.

In this form, the power rail line 120 is located in the substrate 100 in the power rail region 100b and the isolation structure 115.

In this form, the gate structure 130 is located on the isolation structure 115. Therefore, a top surface of the power rail line 120 is lower than the top surface of the isolation structure 115, to prevent the gate structure 130 from being in contact with the power rail line 120.

It should be noted that for ease of illustration and description, an example in which the power rail line 120 is located between two adjacent device regions 100a is used, and both sides of the power rail line 120 are provided with the channel structures 110 and the source/drain doped regions 140 located in the channel structures 110. However, a position relationship among the power rail line 120, the channel structure 110, and the source/drain doped region 140 is not limited thereto. For example, in another form, only one side of the power rail line is provided with the channel structure, and the other side is not provided with the channel structure.

Correspondingly, in this form, the semiconductor structure further includes: a covering dielectric layer 160 (with reference to FIG. 6), located in the isolation structure 115 and covering the top of the power rail line 120.

The covering dielectric layer 160 is configured to isolate the power rail line 120 from the gate structure 130 or isolate the power rail line 120 from another conductive structure located on the isolation structure 115.

A material of the covering dielectric layer 160 is a dielectric material such as at least one of silicon oxide, silicon oxynitride, or silicon nitride. In this form, the covering dielectric layer 160 and the isolation structure 115 are made of the same material, which is beneficial to improving process compatibility.

In this form, a top surface of the covering dielectric layer 160 is flush with the top surface of the isolation structure 115.

In this form, the semiconductor structure further includes: an insulation layer 125, located between the power rail line 120 and the substrate 100, between the power rail line 120 and the isolation structure 115, and between the covering dielectric layer 160 and the isolation structure 115.

The insulation layer 125 is configured to implement insulation between the power rail line 120 and the substrate 100. Therefore, a material of the insulation layer 125 is an insulation material such as silicon oxide, silicon oxynitride, or silicon nitride.

The gate structure 130 is a device gate, and is configured to control opening or closing of a conductive channel when the device is working. In this form, the gate structure 130 is located on the isolation structure 115.

In this form, the channel structure 110 is a fin, and the gate structure 130 extends across the fin correspondingly and covers a part of a top and a part of a side wall of the fin. In another form, when the channel structure is a channel structure layer spaced apart from the substrate, the channel structure layer includes one or more spaced channel layers, and the gate structure correspondingly surrounds the channel layer.

In this form, an extending direction (as shown by the Y direction in FIG. 3) of the gate structure 130 is perpendicular to extending directions of the channel structure 110 and the power rail line 120, that is, the gate structure 130 extends in the longitudinal direction.

In this form, the gate structure 130 is a metal gate (MG) structure. The gate structure 130 includes a gate dielectric layer (not shown in the figure), a work function layer (not shown in the figure) located on the gate dielectric layer, and a gate electrode layer (not shown in the figure) located on the work function layer.

In another form, according to actual process requirements, the gate structure may be alternatively a polysilicon gate structure.

It should be noted that, in an actual process, a gate cap layer (not shown in the figure) may further be formed at the top of the gate structure 130. The gate cap layer is configured to protect the top of the gate structure 130, to reduce a possibility of damage to the gate structure 130.

The source/drain doped region 140 is used for providing a carrier source when the device is working. In this form, the source/drain doped regions 140 are located in the fins on two sides of the gate structure 130. In this form, when the NMOS transistor is formed, the source/drain doped region 140 includes a stress layer doped with N-type ions; and when the PMOS transistor is formed, the source/drain doped region 140 includes a stress layer doped with P-type ions.

The interlayer dielectric layer 150 is configured to isolate the adjacent devices, and the interlayer dielectric layer 150 is further configured to electrically isolate adjacent conductive structures. In this form, the interlayer dielectric layer 150 is located on the isolation structure 115 at a side portion of the gate structure 130, and the interlayer dielectric layer 150 further covers the covering dielectric layer 160.

A material of the interlayer dielectric layer 150 is an insulation material. In this form, the material of the interlayer dielectric layer 150 is silicon oxide.

The power rail contact plug (via-buried power rail (VBPR)) 200 is in contact with the power rail line 120, to implement an electrical connection between the power rail line 120 and an external circuit or other interconnection structures, so as to supply power to different components of a chip.

In this form, the power rail contact plug 200 is in full contact with the top surface of the power rail line 120 in the longitudinal direction. Compared with a case that the power rail contact plug is only in contact with a part of the top surface of the power rail line in the longitudinal direction, in this form, a dimension of the power rail contact plug 200 in the longitudinal direction and a contact area between the power rail contact plug 200 and the power rail line 120 are increased, to further help to reduce a resistance of the power rail contact plug 200 and a contact resistance between the power rail line 120 and the power rail contact plug 200, thereby optimizing the performance of the semiconductor structure.

In this form, that the power rail contact plug 200 is in full contact with the top surface of the power rail line 120 in the longitudinal direction is that a dimension of the power rail line 120 in contact with the power rail contact plug 200 in the longitudinal direction is the same as a width of the power rail line 120 in the longitudinal direction, so that the top surface of the power rail line 120 can be completely covered by the power rail contact plug 200 in the longitudinal direction, to maximize the contact area between the power rail contact plug 200 and the power rail line 120 and maximize the dimension of the power rail contact plug 200 in the longitudinal direction.

In this form, the power rail contact plug 200 penetrates the covering dielectric layer 160 and the interlayer dielectric layer 150 that are at the top of the power rail line 120.

The source/drain contact layer 210 is in contact with the source/drain doped region 140, to implement an electrical connection between the source/drain doped region 140 and an external circuit or other interconnection structures.

In this form, the source/drain contact layer 210 is located on the power rail contact plug 200 and covers a top surface of the power rail contact plug 200, so that the source/drain contact layer 210 is electrically connected to the power rail line 120 by the power rail contact plug 200, to supply power to the source/drain doped region 140 through the power rail line 120 when the device is working.

In this form, the source/drain contact layer 210 extends in the longitudinal direction, and an extending direction of the source/drain contact layer 210 is perpendicular to the extending direction of the power rail line 120.

In this form, on the projection surface parallel to the substrate 100, the source/drain contact layer 210 extends across the power rail line 120, and the extending direction of the source/drain contact layer 210 is perpendicular to the extending direction of the power rail line 120. In addition, the source/drain contact layer 210 is located on the power rail contact plug 200 and covers the top surface of the power rail contact plug 200. Therefore, the power rail contact plug 200 can be accurately positioned by using positions of the source/drain contact layer 210 and the power rail line 120, so that the power rail contact plug 200 is located at an overlapping position between a pattern of the source/drain contact layer 210 and a pattern of the power rail line 120.

In this form, the source/drain contact layer 210 and the power rail contact plug 200 are formed by using a dual damascene process, and the source/drain contact layer 210 and the power rail contact plug 200 are an integrated structure, to further reduce resistances of the source/drain contact layer 210 and the power rail contact plug 200 and a contact resistance between the source/drain contact layer and the power rail contact plug and improve contact performance between the source/drain contact layer 210 and the power rail contact plug 200, thereby improving the performance of the semiconductor structure.

Therefore, a material of the source/drain contact layer 210 is the same as that of the power rail contact plug 200. The materials of the source/drain contact layer 210 and the power rail contact plug 200 are conductive materials. In this form, the materials of the source/drain contact layer 210 and the power rail contact plug 200 are metal materials such as one or more of W, Co, Cu, Ru, and Ni.

It should be noted that for ease of illustration and description, in this form, an example in which the power rail line 120 is located between two adjacent device regions 100*a* is used, and both sides of the power rail line 120 are provided with the channel structures 110 and the source/drain doped regions 140 located in the channel structures 110. However, a position relationship among the power rail line 120, the channel structure 110, and the source/drain doped region 140 is not limited thereto.

For example, in another form, in the longitudinal direction, only one side of the power rail line is provided with the channel structure, and the other side is not provided with the channel structure. When only one side of the power rail line is provided with the channel structure, on the projection surface parallel to the substrate, the source/drain contact layer extends across the power rail line, to enable the source/drain contact layer to further extend to the interlayer dielectric layer on the other side of the power rail line, so as to correspondingly increase a volume of the source/drain contact layer, and the source/drain contact layer and the power rail line are an integrated structure, which is beneficial to reducing resistances of the source/drain contact layer and the power rail line, thereby optimizing the performance of the semiconductor structure.

In an example, the semiconductor structure further includes: a division layer 230, penetrating the source/drain contact layer 210 located between the power rail contact plug 200 and an adjacent channel structure 110, where the division layer 230 divides the source/drain contact layer 210 in the longitudinal direction.

With the division layer 230, based on design requirements, the source/drain contact layer 210 is disconnected from the power rail contact plug 200 that does not need to be electrically connected. In addition, in this form, a dimension w and a position of the division layer 230 can further be adjusted to adjust a distance d between the division layer 230 and the power rail contact plug 200, so that the source/drain contact layer 210 connected to the power rail contact plug 200 further extends to the other side of the power rail contact plug 200, to further help to increase volumes of the power rail contact plug 200 and the connected source/drain contact layer 210, and correspondingly reduce resistances of the power rail contact plug 200 and the source/drain contact layer 210, thereby improving the performance of the semiconductor structure.

To ensure a division effect of the division layer 230, a material of the division layer 230 is a dielectric material.

In this form, the division layer 230 may be a single-layer or a multi-layer structure, and the material of the division layer 230 includes one or more of silicon oxide, silicon nitride, silicon oxynitride, silicon carbonitride, and silicon oxycarbide.

It should be noted that a width w of the division layer 230 in the longitudinal direction should not be excessively small or excessively large. If the width w of the division layer 230 in the longitudinal direction is excessively small, a division effect of the division layer 230 on the source/drain contact layer 210 tends to be reduced. If the width w of the division layer 230 in the longitudinal direction is excessively large, the division layer 230 tends to occupy an excessively large area. To this end, in this form, the width w of the division layer 230 in the longitudinal direction is 5 nm to 30 nm.

It should further be noted that, in this form, an example in which the semiconductor structure includes the division layer 230 is used for description. In another form, according to actual process requirements, the semiconductor structure may not include the division layer, or the division layer is disposed in some regions of the source/drain contact layer.

Accordingly, the present disclosure further provides a forming method of a semiconductor structure. FIG. 5 to FIG. 17 are schematic structural diagrams corresponding to steps in one form of a forming method of a semiconductor structure according to the present disclosure.

Figure 5:
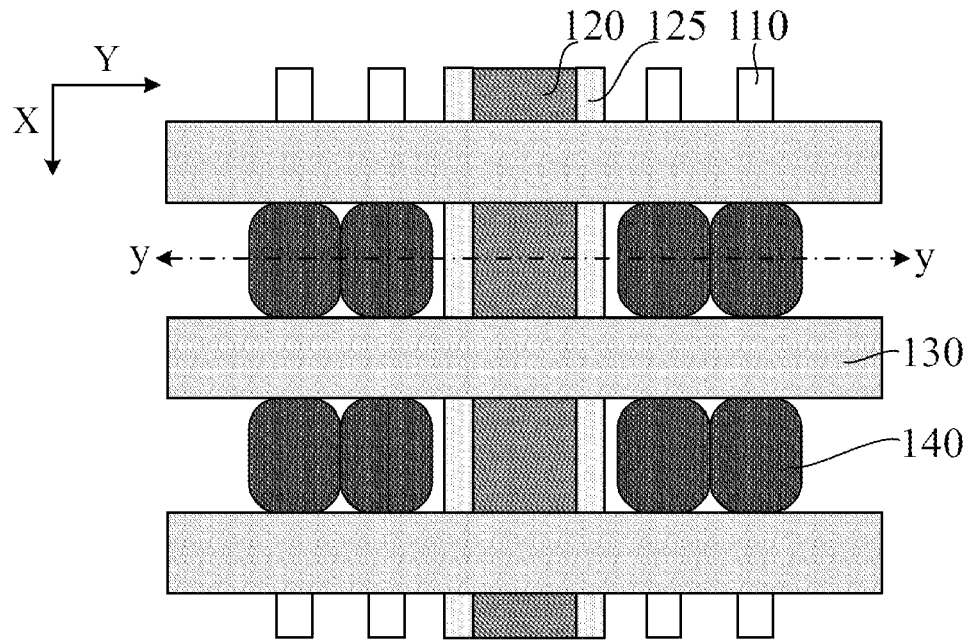
FIG. 5 to FIG. 17 are schematic structural diagrams corresponding to steps in one form of a forming method of a semiconductor structure according to the present disclosure.
Figure 6:
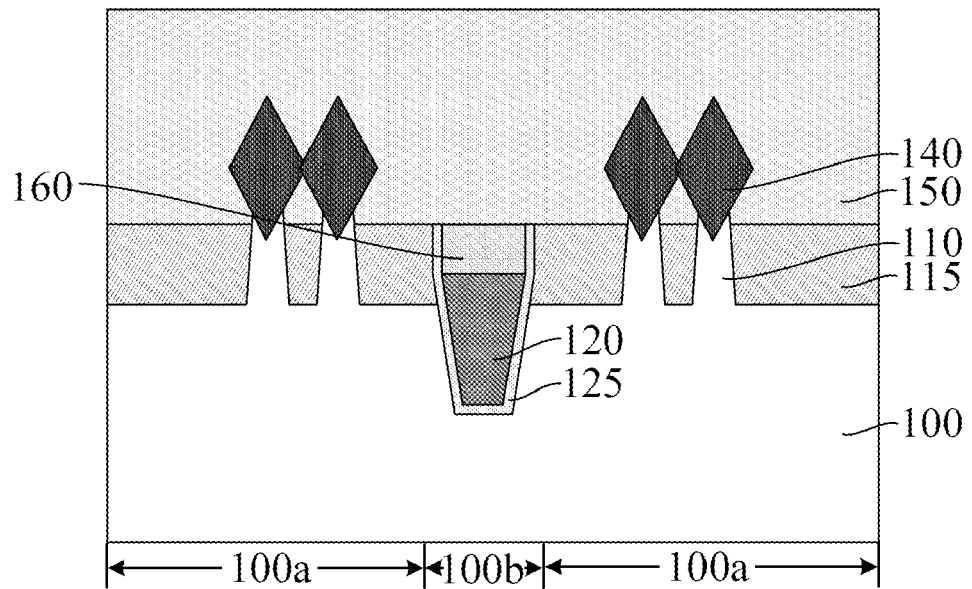

Referring to FIG. 5 and FIG. 6, FIG. 5 is a top view, and FIG. 6 is a cross-sectional view of FIG. 5 in a y-y direction. A substrate 100 is provided, including a plurality of discrete device regions 100a and a power rail region 100b located between the device regions 100a, discrete channel structures 110 are formed on the substrate 100 in the device regions 100a, a power rail line 120 is formed in the substrate 100 in the power rail region 100b, both the power rail line 120 and the channel structure 110 extend in a transverse direction (as shown by an X direction in FIG. 5), a direction perpendicular to the transverse direction is a longitudinal direction (as shown by a Y direction in FIG. 5), a gate structure 130 extending across the channel structure 110 is formed on the substrate 100, source/drain doped regions 140 are formed in the channel structures 110 on two sides of the gate structure 130, and an interlayer dielectric layer 150 covering the source/drain doped region 140 and the power rail line 120 is formed at a side portion of the gate structure 130.

The substrate 100 is configured to provide a process platform for forming a semiconductor structure.

In this form, the substrate 100 is a silicon substrate. In another form, a material of the substrate may be alternatively germanium, silicon germanium, silicon carbide, gallium arsenide, indium gallium, or another material suitable for process requirements or easy to integrate.

The device region 100a is used for forming an FET, for example, one or two of a PMOS transistor and an NMOS transistor. The power rail region 100b is used for arranging the power rail line 120.

When the device is working, the channel structure 110 is configured to provide a conductive channel of the FET. In this form, there are a plurality of channel structures 110, and the plurality of channel structures 110 are arranged in parallel at intervals.

In an example, the channel structure 110 is a fin. Correspondingly, the device region 100a is used for forming a FinFET. In this form, a material of the fin is the same as the material of the substrate 100, and the material of the fin is silicon. In another form, the material of the fin may be alternatively a semiconductor material suitable for forming a fin, such as germanium, silicon germanium, silicon carbide, gallium arsenide, or indium gallium, and the material of the fin may be alternatively different from the material of the substrate.

In some other forms, the channel structure may be alternatively a channel structure layer spaced apart from the substrate, the channel structure layer includes one or more spaced channel layers, and the gate structure covers a part of a top of the channel structure and surrounds the channel layer. Correspondingly, the device region is used for forming a GAA transistor or a forksheet transistor.

In this form, an isolation structure 115 covering a part of a side wall of the channel structure 110 is further formed on the substrate 100. A top surface of the isolation structure 115 is lower than a top surface of the channel structure 110.

The isolation structure 115 is configured to isolate adjacent channel structures 110, and the isolation structure 115 is further configured to isolate the substrate 100 from the gate structure 130. In this form, the channel structure 110 is a fin, a part, exposed from the isolation structure 115, of the fin is used as an active fin, and the active fin is configured to provide a conductive channel for operation of the device.

In this form, the isolation structure 115 is an STI structure, and a material of the isolation structure 115 is an insulation material such as at least one of silicon oxide, silicon oxynitride, or silicon nitride.

The power rail line 120 is configured to provide power to different components of a chip. In this form, the power rail line 120 is located in the substrate 100 in the power rail region 100b, and the power rail line 120 is a BPR, which is beneficial to releasing wiring resources that are interconnected in a BEOL and reducing a height of a standard cell, to meet a requirement of continuous scaling of a logic chip. In addition, the BPR uses a technology of scaling a pitch and increasing a BEOL resistance, which is also beneficial to providing a relatively low resistance and local current distribution.

In this form, the power rail line 120 is a long-strip-shaped structure, the power rail line 120 is parallel to an extending direction of the channel structure 110, and there is an interval between the power rail line 120 and the channel structure 110.

A material of the power rail line 120 is a conductive material. In this form, the material of the power rail line 120 is a metal material, including one or more of Co, W, Ni, and Ru. The power rail line 120 has a relatively low resistivity through selection of these materials, which is beneficial to alleviating RC delay and improving a processing speed of a chip.

In this form, the power rail line 120 is located in the substrate 100 in the power rail region 100b and the isolation structure 115.

In this form, the gate structure 130 is located on the isolation structure 115. Therefore, a top surface of the power rail line 120 is lower than the top surface of the isolation structure 115, to prevent the gate structure 130 from being in contact with the power rail line 120.

Correspondingly, in this form, a covering dielectric layer 160 located at a top of the power rail line 120 is further formed in the isolation structure 115.

The covering dielectric layer 160 is configured to isolate the power rail line 120 from the gate structure 130 or isolate the power rail line 120 from another conductive structure located on the isolation structure 115. A material of the covering dielectric layer 160 is a dielectric material such as one or more of silicon oxide, silicon oxynitride, and silicon nitride. In this form, the covering dielectric layer 160 and the isolation structure 115 are made of the same material, which is beneficial to improving process compatibility.

In this form, a top surface of the covering dielectric layer 160 is flush with the top surface of the isolation structure 115.

In this form, an insulation layer 125 is further formed between the power rail line 120 and the substrate 100, between the power rail line 120 and the isolation structure 115, and between the covering dielectric layer 160 and the isolation structure 115.

The insulation layer 125 is configured to implement insulation between the power rail line 120 and the substrate 100. Therefore, a material of the insulation layer 125 is an insulation material such as silicon oxide, silicon oxynitride, or silicon nitride.

The gate structure 130 is a device gate, and is configured to control opening or closing of a conductive channel when the device is working. In this form, the gate structure 130 is located on the isolation structure 115.

In this form, the channel structure 110 is a fin, and the gate structure 130 extends across the fin correspondingly and covers a part of a top and a part of a side wall of the fin. In another form, when the channel structure is a channel structure layer spaced apart from the substrate, the channel structure layer includes one or more spaced channel layers, and the gate structure correspondingly surrounds the channel layer.

In this form, an extending direction (as shown by the Y direction in FIG. 5) of the gate structure 130 is perpendicular to extending directions of the channel structure 110 and the power rail line 120, that is, the gate structure 130 extends in the longitudinal direction.

In this form, the gate structure 130 is an MG structure. The gate structure 130 includes a gate dielectric layer (not shown in the figure), a work function layer (not shown in the figure) located on the gate dielectric layer, and a gate electrode layer (not shown in the figure) located on the work function layer.

In another form, according to an actual process, the gate structure may be alternatively a polysilicon gate structure.

It should be noted that, in an actual process, a gate cap layer (not shown in the figure) may further be formed at the top of the gate structure 130. The gate cap layer is configured to protect the top of the gate structure 130, to reduce a possibility of damage to the gate structure 130.

The source/drain doped region 140 is used for providing a carrier source when the device is working. In this form, the source/drain doped regions 140 are located in the fins on two sides of the gate structure 130. In this form, when the NMOS transistor is formed, the source/drain doped region 140 includes a stress layer doped with N-type ions; and when the PMOS transistor is formed, the source/drain doped region 140 includes a stress layer doped with P-type ions.

The interlayer dielectric layer 150 is configured to isolate the adjacent devices, and the interlayer dielectric layer 150 is further configured to electrically isolate adjacent conductive structures. In this form, the interlayer dielectric layer 150 is located on the isolation structure 115 at a side portion of the gate structure 130, and the interlayer dielectric layer 150 further covers the covering dielectric layer 160.

A material of the interlayer dielectric layer 150 is an insulation material. In this form, the material of the interlayer dielectric layer 150 is silicon oxide.

It should be noted that for ease of illustration and description, in this form, the substrate 100, the isolation structure 115, the covering dielectric layer 160, and the interlayer dielectric layer 150 are merely shown in the cross-sectional view.

Figure 7:
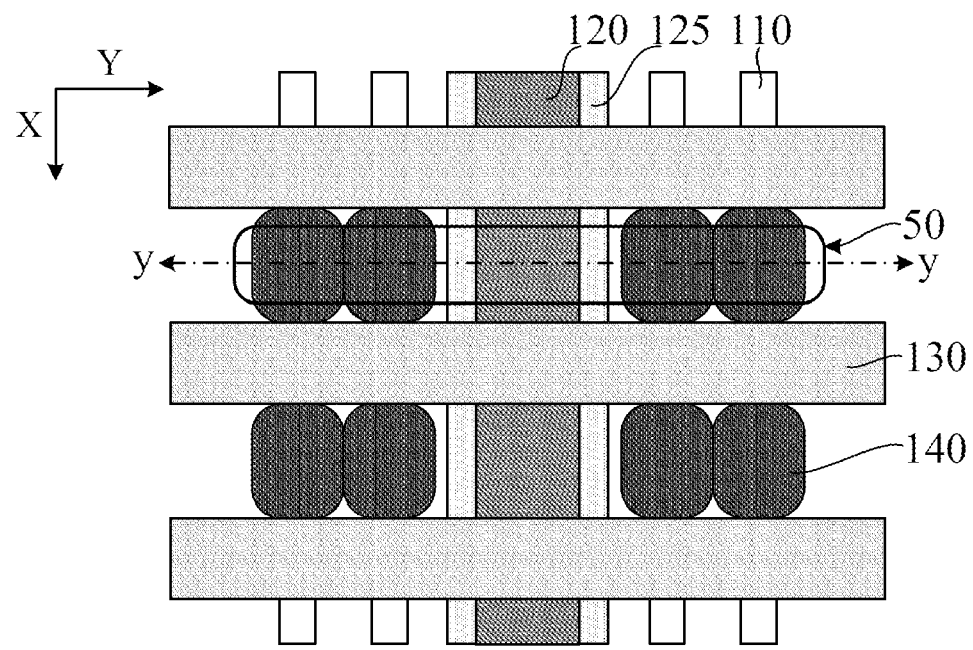
Figure 8:
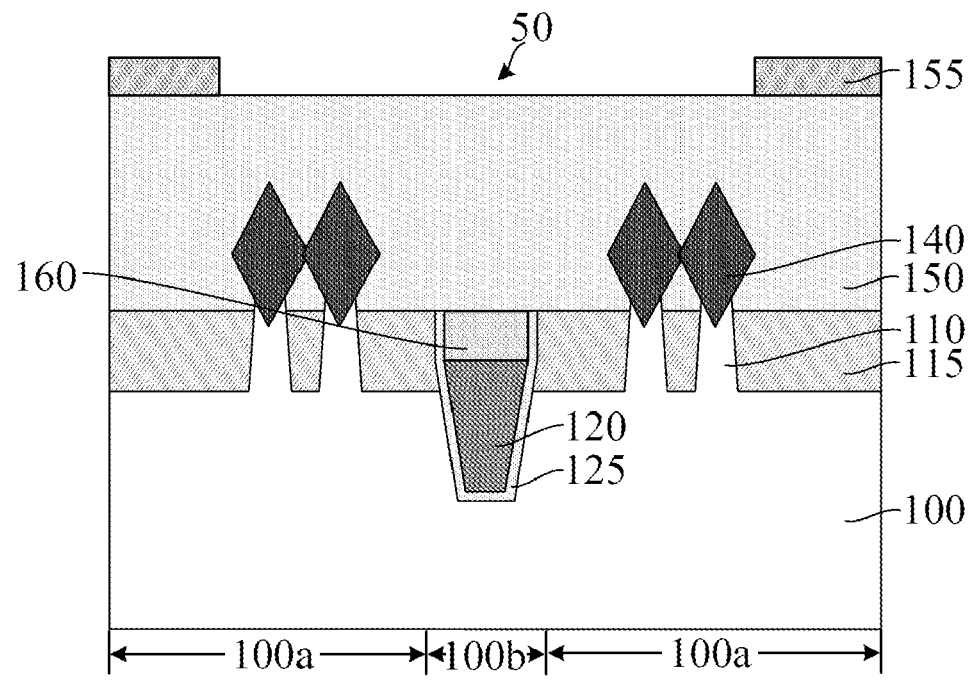
Figure 9:
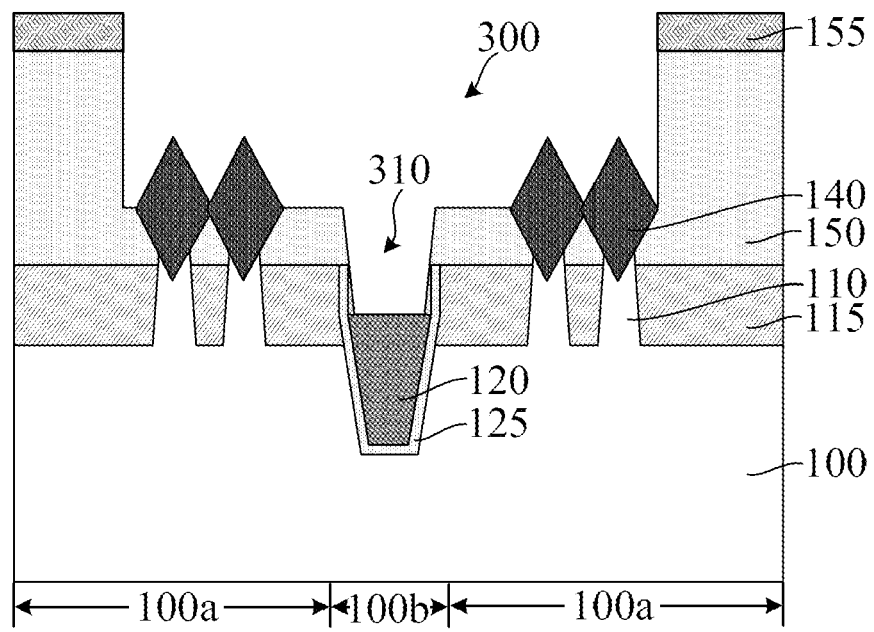

Referring to FIG. 7 to FIG. 9, an interconnection groove 300 (as shown in FIG. 9) penetrating the interlayer dielectric layer 150 at a top of the source/drain doped region 140 and a conductive via 310 (as shown in FIG. 9) located at a bottom of the interconnection groove 300 and penetrating the interlayer dielectric layer 150 at the top of the power rail line 120 are formed. On a projection surface parallel to the substrate 100, the interconnection groove 300 extends across the power rail line 120, and a bottom of the conductive via 310 exposes an entire top surface of the power rail line 120 in the longitudinal direction.

The conductive via 310 is configured to provide a spatial position for forming a power rail contact plug.

The bottom of the conductive via 310 exposes the entire top surface of the power rail line 120 in the longitudinal direction, compared with a case that the bottom of the conductive via only exposes a part of the top surface of the power rail line, in this form, an exposed area of the top of the power rail line 120 in the longitudinal direction is increased, and a dimension of the conductive via 310 in the longitudinal direction is increased. Therefore, in the subsequent step of forming a power rail contact plug filled in the conductive via 310, the power rail contact plug can be in full contact with the top surface of the power rail line 120 in the longitudinal direction, to help to increase a dimension of the power rail contact plug and a contact area between the power rail contact plug and the power rail line 120.

In this form, the bottom of the conductive via 310 exposes the entire top surface of the power rail line 120 in the longitudinal direction, that is, a dimension of the power rail line 120 exposed by the conductive via 310 in the longitudinal direction is the same as a width of the power rail line 120 in the longitudinal direction.

In this form, in the step of forming the conductive via 310, the conductive via 310 penetrates the covering dielectric layer 160 and the interlayer dielectric layer 150 that are at the top of the power rail line 120.

The interconnection groove 300 is configured to provide a spatial position for forming a source/drain contact layer. The bottom of the interconnection groove 300 exposes the source/drain doped region 140, to enable the source/drain contact layer to be in contact with the source/drain doped region 140 subsequently.

In this form, the interconnection groove 300 extends in the longitudinal direction, and an extending direction of the interconnection groove 300 is perpendicular to an extending direction of the power rail line 120.

In this form, on the projection surface parallel to the substrate 100, the interconnection groove 300 extends across the power rail line 120, and the extending direction of the interconnection groove 300 is perpendicular to the extending direction of the power rail line 120. In addition, the conductive via 310 is located at the bottom of the interconnection groove 300 and penetrates the interlayer dielectric layer 150 at the top of the power rail line 120. Therefore, the conductive via 310 can be accurately positioned by using positions of the interconnection groove 300 and the power rail line 120, so that the conductive via 310 is located at an overlapping position between a pattern of the interconnection groove 300 and a pattern of the power rail line 120.

In this form, the conductive via 310 is in communication with the interconnection groove 300, so that the source/drain contact layer subsequently formed in the interconnection groove 300 and the power rail contact plug formed in the conductive via 310 are an integrated structure, to further reduce resistances of the source/drain contact layer and the power rail contact plug and a contact resistance between the source/drain contact layer and the power rail contact plug and improve contact performance between the source/drain contact layer and the power rail contact plug.

In this form, the conductive via 310 and the interconnection groove 300 are formed by using a dual damascene process. For example, the conductive via 310 and the interconnection groove 300 may be formed by using a trench first process, or a via first process, or a trench and via all-in-one process.

Specifically, in this form, an example in which the conductive via 310 and the interconnection groove 300 are formed by using the trench first process is used for description.

In an example, the step of forming the interconnection groove 300 and the conductive via 310 includes: forming the interconnection groove 300 penetrating a partial thickness of the interlayer dielectric layer 150 at the top of the source/drain doped region 140; and forming the conductive via 310 penetrating the interlayer dielectric layer 150 at the bottom of the interconnection groove 300.

With a manner of first forming the interconnection groove 300 and then forming the conductive via 310, in the process of forming the conductive via 310, self-aligned etching can be performed at the position of the interconnection groove 300 in the transverse direction, which is beneficial to reducing process difficulty of forming the conductive via 310 and increasing a process window for forming the conductive via 310, to facilitate accurate positioning of the conductive via 310.

Specifically, in this form, the process of forming the interconnection groove 300 includes the following steps.

As shown in FIG. 7 and FIG. 8, FIG. 7 is a top view, and FIG. 8 is a cross-sectional view of FIG. 7 in a y-y direction. A hard mask layer 155 is formed on the interlayer dielectric layer 150, a mask opening 50 located above the source/drain doped region 140 is formed in the hard mask layer 155, the mask opening 50 extends in the longitudinal direction, and on the projection surface parallel to the substrate 100, the mask opening 50 extends across the power rail line 120.

The hard mask layer 155 is used as an etching mask for forming the interconnection groove. The mask opening 50 is configured to define a pattern and a position of the interconnection groove. For ease of illustration and description, a pattern and a position of the mask opening 50 are shown in FIG. 7 by using a solid box.

To ensure that the hard mask layer 155 can function as the etching mask, a material having etching selectivity to the material of the interlayer dielectric layer 150 is selected for the hard mask layer 155. For example, a material of the hard mask layer 155 may be titanium nitride, titanium oxide, or silicon nitride. In an example, the material of the hard mask layer 155 is titanium nitride.

On the projection surface parallel to the substrate 100, the mask opening 50 extends across the power rail line 120. Correspondingly, on the projection surface parallel to the substrate 100, an area in which the mask opening 50 and the power rail line 120 overlap with each other is defined as a formation area of the conductive via.

As shown in FIG. 9, the partial thickness of the interlayer dielectric layer 150 is etched along the mask opening 50 by using the hard mask layer 155 as a mask, to form the interconnection groove 300. The interconnection groove 300 exposes the source/drain doped region 140.

Specifically, the partial thickness of the interlayer dielectric layer 150 exposed by the mask opening 50 is etched by using an anisotropic dry etching process. The anisotropic dry etching process has an anisotropic etching property, which is beneficial to improving controllability of a cross-sectional profile of the interconnection groove 300 and accurately controlling a depth of the interconnection groove 300.

Correspondingly, in this form, the step of forming the conductive via 310 includes: as shown in FIG. 9, etching a part of the interlayer dielectric layer 150 at the bottom of the interconnection groove 300 by using the hard mask layer 155 as an etch stop layer in the transverse direction, to form the conductive via 310.

In the step of forming the conductive via 310, the etching process has a relatively high etching selection ratio between the interlayer dielectric layer 150 and the hard mask layer 155. Therefore, with the hard mask layer 155 as the etch stop layer in the transverse direction, the self-aligned etching can be implemented in the transverse direction by using the etching process, making it difficult to form the conductive via 310, to help to accurately position the conductive via 310.

Specifically, the part of the interlayer dielectric layer 150 at the bottom of the interconnection groove 300 may be etched by using the anisotropic dry etching process, to form the conductive via 310, thereby improving controllability of the cross-section of the conductive via 310.

Figure 10:
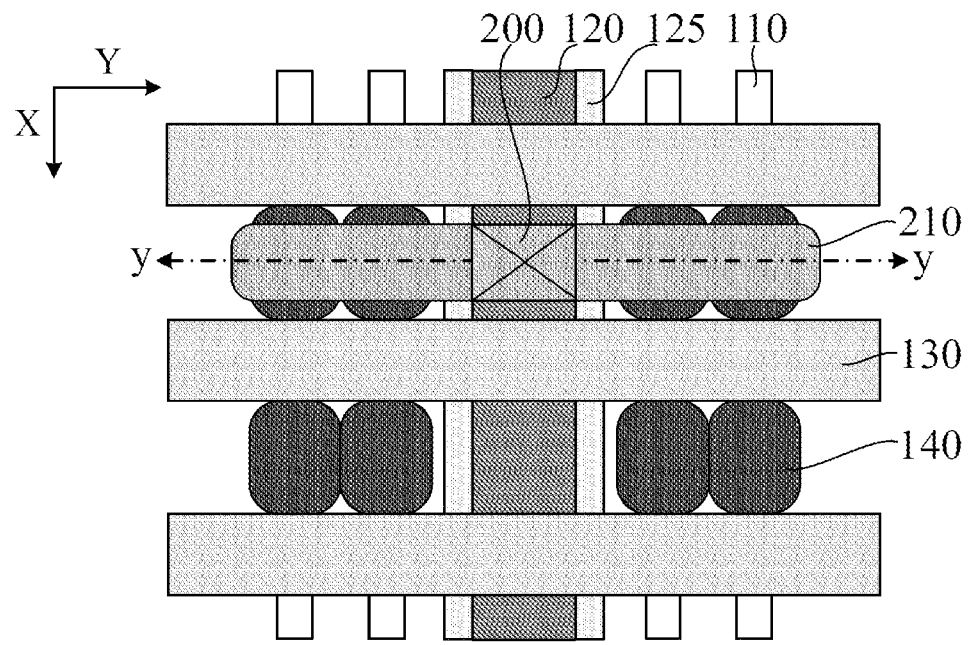
Figure 11:
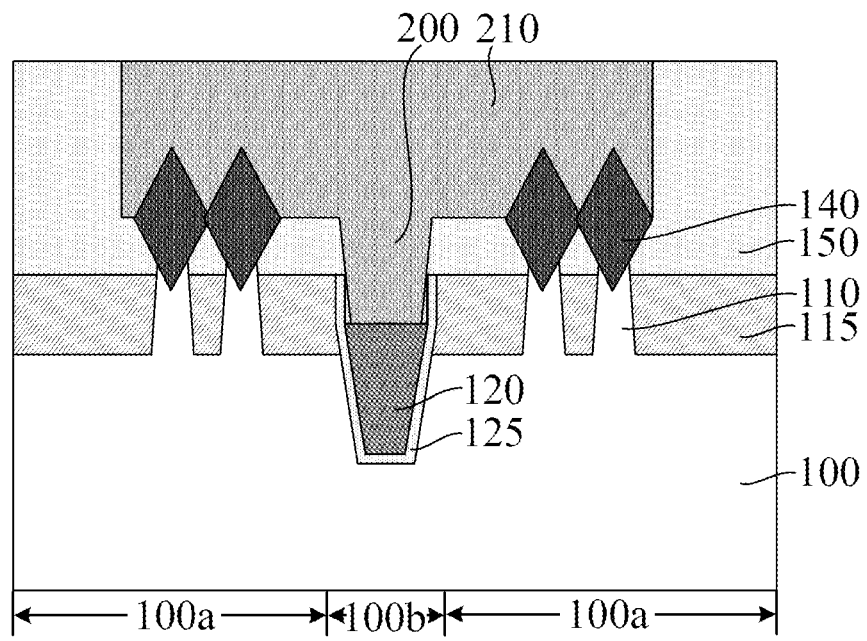

Referring to FIG. 10 and FIG. 11, FIG. 10 is a top view, and FIG. 11 is a cross-sectional view of FIG. 10 in a y-y direction. The conductive via 310 and the interconnection groove 300 are filled, and a power rail contact plug 200 filled in the conductive via 310 and a source/drain contact layer 210 filled in the interconnection groove 300 are formed. The power rail contact plug 200 is in full contact with the top surface of the power rail line 120 in the longitudinal direction, and the source/drain contact layer 210 is in contact with the source/drain doped region 140.

The power rail contact plug (VBPR) 200 is in contact with the power rail line 120, to implement an electrical connection between the power rail line 120 and an external circuit or other interconnection structures, so as to supply power to different components of a chip.

In this form, the power rail contact plug 200 is in full contact with the top surface of the power rail line 120 in the longitudinal direction. Compared with a case that the power rail contact plug is only in contact with a part of the top surface of the power rail line in the longitudinal direction, in this form, a dimension of the power rail contact plug 200 in the longitudinal direction and a contact area between the power rail contact plug 200 and the power rail line 120 are increased, to further help to reduce a resistance of the power rail contact plug 200 and a contact resistance between the power rail line 120 and the power rail contact plug 200, thereby optimizing the performance of the semiconductor structure.

In addition, in this form, the interconnection groove 300 and the conductive via 310 in communication with each other are first formed, so that the power rail contact plug 200 filled in the conductive via 310 and the source/drain contact layer 210 filled in the interconnection groove 300 can be subsequently formed by using a filling process in the same step. The power rail contact plug 200 and the source/drain contact layer 210 are an integrated structure correspondingly, to help to reduce a contact resistance between the power rail contact plug 200 and the source/drain contact layer 210, thereby improving the performance of the semiconductor structure.

In this form, that the power rail contact plug 200 is in full contact with the top surface of the power rail line 120 in the longitudinal direction is that a dimension of the power rail line 120 in contact with the power rail contact plug 200 in the longitudinal direction is the same as a width of the power rail line 120 in the longitudinal direction, so that the top surface of the power rail line 120 can be completely covered by the power rail contact plug 200 in the longitudinal direction, to maximize the contact area between the power rail contact plug 200 and the power rail line 120 and maximize the dimension of the power rail contact plug 200 in the longitudinal direction.

In this form, the power rail contact plug 200 penetrates the covering dielectric layer 160 and the interlayer dielectric layer 150 that are at the top of the power rail line 120.

The source/drain contact layer 210 is in contact with the source/drain doped region 140, to implement an electrical connection between the source/drain doped region 140 and an external circuit or other interconnection structures.

In this form, the source/drain contact layer 210 is located on the power rail contact plug 200 and covers a top surface of the power rail contact plug 200, so that the source/drain contact layer 210 is electrically connected to the power rail line 120 by the power rail contact plug 200, to supply power to the source/drain doped region 140 through the power rail line 120 when the device is working.

In this form, the source/drain contact layer 210 extends in the longitudinal direction, and an extending direction of the source/drain contact layer 210 is perpendicular to the extending direction of the power rail line 120.

In this form, on the projection surface parallel to the substrate 100, the source/drain contact layer 210 extends across the power rail line 120, and the extending direction of the source/drain contact layer 210 is perpendicular to the extending direction of the power rail line 120. In addition, the source/drain contact layer 210 is located on the power rail contact plug 200 and covers the top surface of the power rail contact plug 200. Therefore, the power rail contact plug 200 can be accurately positioned by using positions of the source/drain contact layer 210 and the power rail line 120, so that the power rail contact plug 200 is located at an overlapping position between a pattern of the source/drain contact layer 210 and a pattern of the power rail line 120.

Therefore, a material of the source/drain contact layer 210 is the same as that of the power rail contact plug 200. The materials of the source/drain contact layer 210 and the power rail contact plug 200 are conductive materials. In this form, the materials of the source/drain contact layer 210 and the power rail contact plug 200 are metal materials such as one or more of W, Co, Cu, Ru, and Ni.

In this form, the step of forming the source/drain contact layer 210 and the power rail contact plug 200 includes the following steps.

Conductive materials (not shown in the figure) are filled in the conductive via 310 and the interconnection groove 300, and the conductive material is further formed on the interlayer dielectric layer 150; and the conductive material located on the interlayer dielectric layer 150 is removed by using a planarization process, the remaining conductive material located in the conductive via 310 is used as the power rail contact plug 200, and the remaining conductive material located in the interconnection groove 300 is used as the source/drain contact layer 210.

In this form, a process of forming the conductive material may include one or more of a physical vapor deposition process, a chemical vapor deposition process, and an electrochemical plating process.

In this form, the planarization process may be a chemical mechanical planarization (CMP) process.

It should be noted that in this form, in the step of removing the conductive material located on the interlayer dielectric layer 150, the hard mask layer 155 is further removed by using the planarization process.

It should further be noted that for ease of illustration and description, in this form, an example in which the power rail line 120 is located between two adjacent device regions 100a is used, and both sides of the power rail line 120 are formed with the channel structures 110 and the source/drain doped regions 140 located in the channel structures 110. However, a position relationship among the power rail line 120, the channel structure 110, and the source/drain doped region 140 is not limited thereto.

For example, in another form, in the longitudinal direction, only one side of the power rail line is provided with the channel structure, and the other side is not provided with the channel structure. When only one side of the power rail line is provided with the channel structure, on the projection surface parallel to the substrate, the source/drain contact layer extends across the power rail line, to enable the source/drain contact layer to further extend to the interlayer dielectric layer on the other side of the power rail line, so as to correspondingly increase a volume of the source/drain contact layer, and the source/drain contact layer and the power rail line are an integrated structure, which is beneficial to reducing resistances of the source/drain contact layer and the power rail line, thereby optimizing the performance of the semiconductor structure.

Referring to FIG. 12 to FIG. 17, in this form, the forming method of a semiconductor structure further includes: forming a division layer 230 penetrating the source/drain contact layer 210 located between the power rail contact plug 200 and an adjacent channel structure 110 after the source/drain contact layer 210 and the power rail contact plug 200 are formed, where the division layer 230 divides the source/drain contact layer 210 in the longitudinal direction.

With the division layer 230, based on design requirements, the source/drain contact layer 210 can be disconnected from the power rail contact plug 200 that does not need to be electrically connected. In addition, in this form, a dimension w and a position of the division layer 230 can further be adjusted to adjust a distance d between the division layer 230 and the power rail contact plug 200, so that the source/drain contact layer 210 connected to the power rail contact plug 200 further extends to the other side of the power rail contact plug 200, to further help to increase volumes of the power rail contact plug 200 and the connected source/drain contact layer 210, and correspondingly reduce resistances of the power rail contact plug 200 and the source/drain contact layer 210, thereby improving the performance of the semiconductor structure.

To ensure a division effect of the division layer 230, a material of the division layer 230 is a dielectric material.

In this form, the division layer 230 may be a single-layer or a multi-layer structure, and the material of the division layer 230 includes one or more of silicon oxide, silicon nitride, silicon oxynitride, silicon carbonitride, and silicon oxycarbide.

It should be noted that a width w of the division layer 230 in the longitudinal direction should not be excessively small or excessively large. If the width w of the division layer 230 in the longitudinal direction is excessively small, a division effect of the division layer 230 on the source/drain contact layer 210 tends to be reduced. If the width w of the division layer 230 in the longitudinal direction is excessively large, the division layer 230 tends to occupy an excessively large area. To this end, in this form, the width w of the division layer 230 in the longitudinal direction is 5 nm to 30 nm.

The specific steps that the division layer 230 is formed in this form are described in detail below with reference to the accompanying drawings.

As shown in FIG. 12 to FIG. 15, a division groove 240 penetrating the source/drain contact layer 210 located between the power rail contact plug 200 and an adjacent channel structure 110 is formed, and the division groove 240 penetrates the source/drain contact layer 210 in the transverse direction. The division groove 240 is configured to provide a spatial position for forming the division layer 230.

Figure 12:
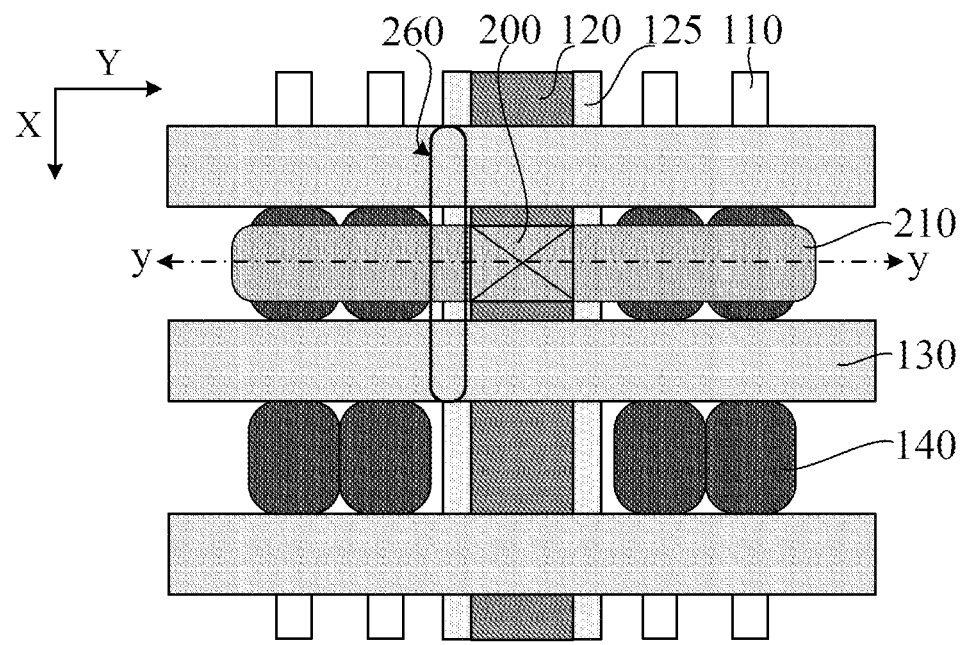
Figure 13:
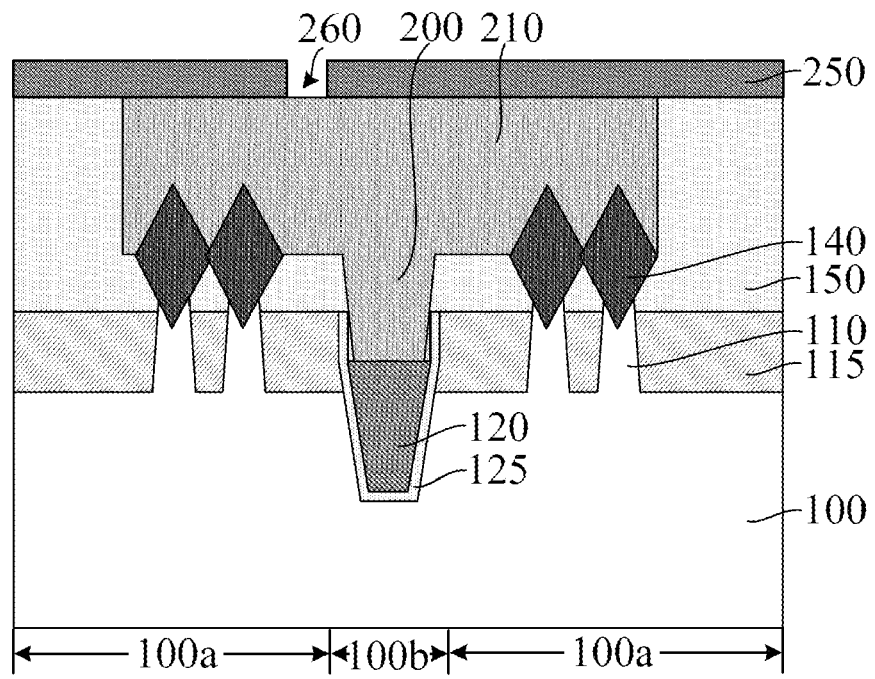
Figure 14:
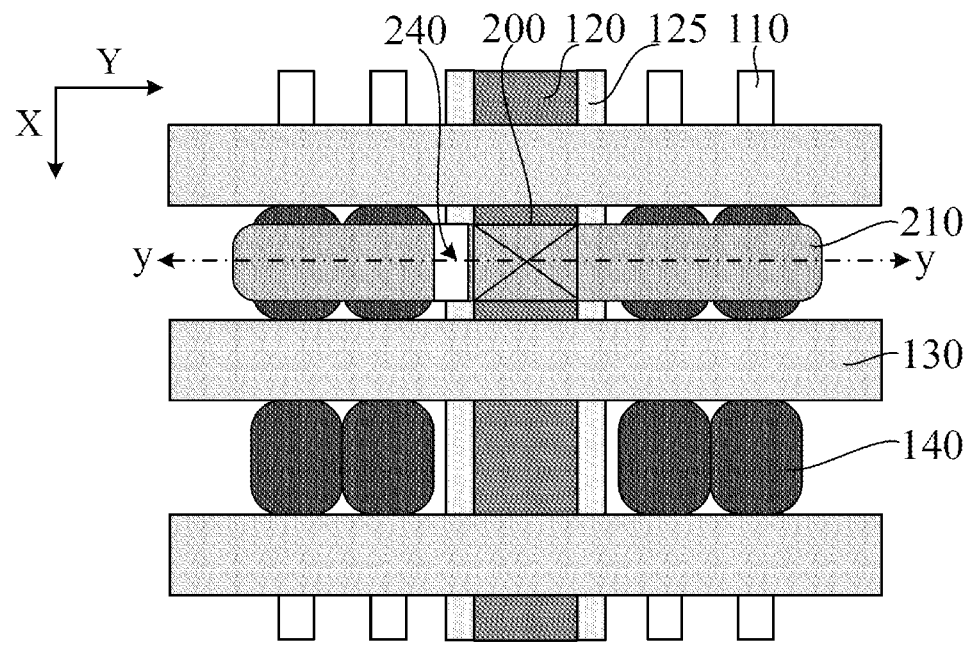
Figure 15:
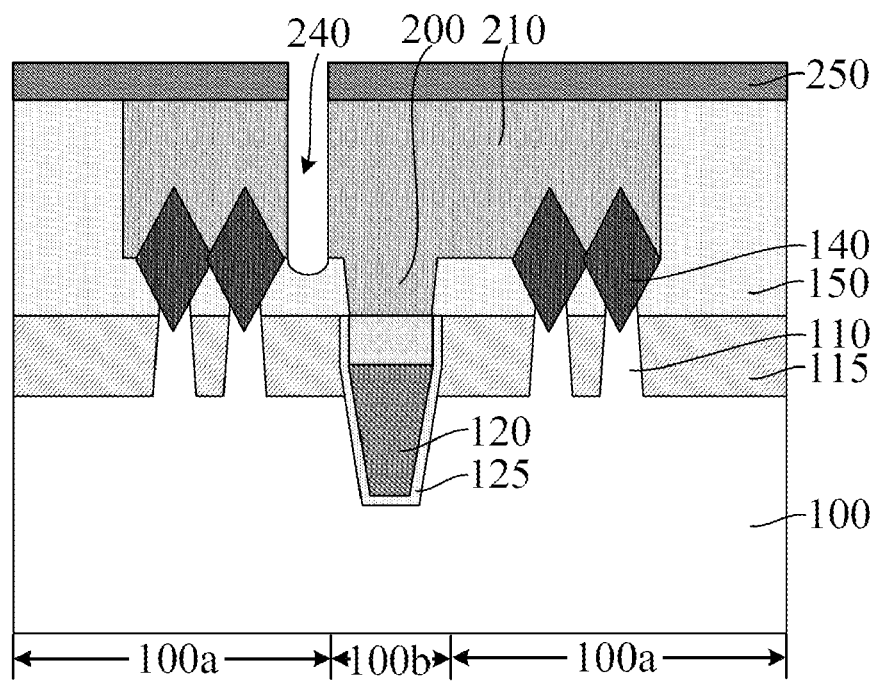

In an example, the step of forming the division groove 240 includes: as shown in FIG. 12 and FIG. 13, FIG. 12 is a top view, and FIG. 13 is a cross-sectional view of FIG. 12 in a y-y direction, forming a cutting mask layer 250 on the interlayer dielectric layer 150 and the source/drain contact layer 210, and forming a cutting opening 260 in the cutting mask layer 250, where the cutting opening 260 is located above the source/drain contact layer 210 between the power rail contact plug 200 and the adjacent channel structure 110 and extends across the source/drain contact layer 210; and as shown in FIG. 14 and FIG. 15, FIG. 14 is a top view, and FIG. 15 is a cross-sectional view of FIG. 14 in a y-y direction, removing, by using the cutting mask layer 250 as a mask, the source/drain contact layer 210 exposed by the cutting opening 260, to form the division groove 240 penetrating the source/drain contact layer 210.

The cutting mask layer 250 is used as an etching mask for forming the division groove 240.

In this form, a material of the cutting mask layer 250 is titanium nitride.

The cutting opening 260 is configured to define a position and a dimension of cutting the source/drain contact layer 210. For ease of illustration and description, a shape and a position of the cutting opening 260 are shown in FIG. 12 by using a solid box.

In this form, the cutting opening 260 is further located above the interlayer dielectric layer 150 adjacent to the source/drain contact layer 210 in the transverse direction, which is beneficial to reducing requirements on the dimensional accuracy of the cutting opening 260 in the transverse direction.

In this form, a gate cap layer (not shown in the figure) may be formed at a top of the gate structure 130. Even if the cutting opening 260 is further located above the gate structure 130, and when the source/drain contact layer 210 below the cutting opening 260 is etched subsequently, the gate cap layer can protect the gate structure 130, to prevent the gate structure 130 from being damaged.

In this form, a process of forming the division groove 240 includes one or two processes of dry etching and wet etching. In an example, the source/drain contact layer 210 exposed by the cutting opening 260 is etched by using the dry etching process and the wet etching process sequentially, to form the division groove 240.

Figure 16:
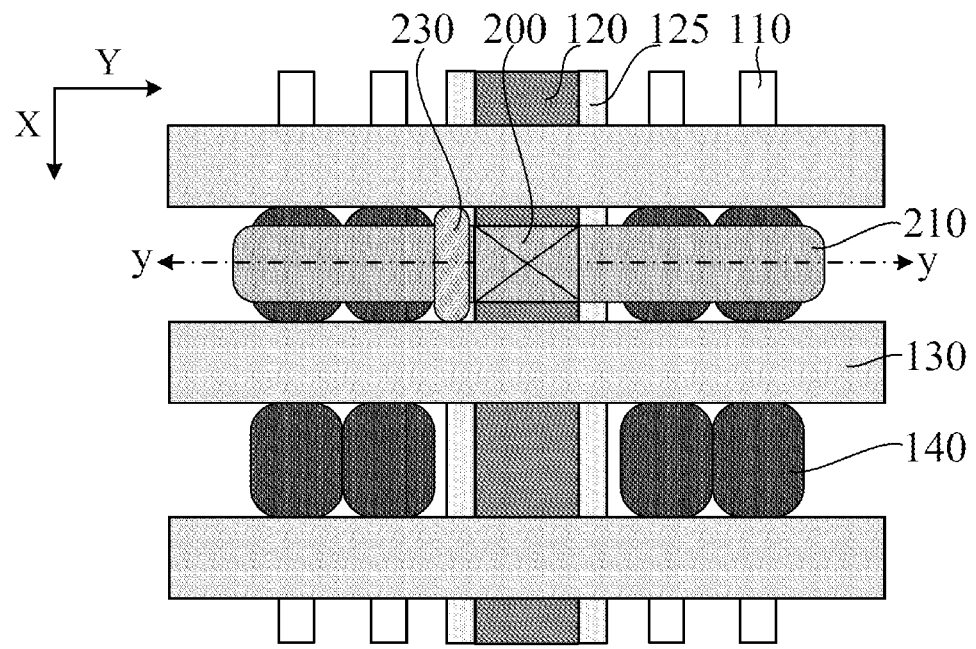
Figure 17:
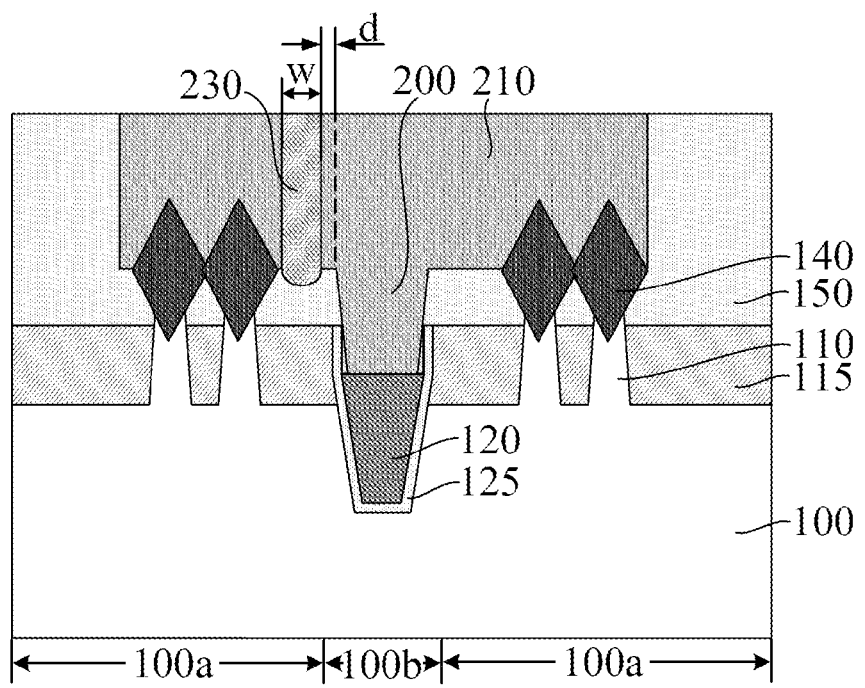

As shown in FIG. 16 and FIG. 17, FIG. 16 is a top view, and FIG. 17 is a cross-sectional view of FIG. 16 in a y-y direction. A dielectric material is filled in the division groove 240, to form the division layer 230.

In this form, a process of filling the dielectric material in the division groove 240 includes at least one of a chemical vapor deposition process, a flowable chemical vapor deposition process, or an atomic layer deposition process. The deposition process has a strong gap filling capability, which is beneficial to improving filling quality of the division layer 230 in the division groove 240, thereby ensuring a division effect of the division layer 230 on the source/drain contact layer 210.

It should be noted that in this form, an example in which the division layer 230 is formed after the source/drain contact layer 210 and the power rail contact plug 200 are formed is used for description.

In another form, in the step of forming the interconnection groove and the conductive via, a division layer located between the conductive via and an adjacent channel structure may further be formed at a bottom of the interconnection groove, and the division layer protrudes from the bottom of the interconnection groove and divides the interconnection groove in the longitudinal direction. Correspondingly, after the source/drain contact layer and the power rail contact plug are formed, the division layer divides the source/drain contact layer in the longitudinal direction.

It should further be noted that, in this form, an example in which the forming method of a semiconductor structure includes forming the division layer 230 is used for description. In another form, according to actual process requirements, the division layer may not be formed, or the division layer is disposed in only some regions of the source/drain contact layer.

Although forms of the present disclosure have been described above, the present disclosure is not limited thereto. Any person skilled in the art can make various changes and modifications without departing from the spirit and the scope of the present disclosure, and therefore the protection scope of the present disclosure should be subject to the scope defined by the claims.

What is claimed is:

1. A semiconductor structure, comprising:
   a substrate, comprising a plurality of discrete device regions and a power rail region located between the device regions of the plurality of discrete device regions;
   discrete channel structures on the substrate in the device regions of the plurality of discrete device regions;
   a power rail line, located in the substrate in the power rail region, wherein both the power rail line and the channel structures extend in a transverse direction, and a direction perpendicular to the transverse direction is a longitudinal direction;
   a gate structure, located on the substrate and extending across the channel structures; source/drain doped regions, located in the channel structures on two sides of the gate structure; an interlayer dielectric layer, located at a side portion of the gate structure and covering the source/drain doped region and the power rail line;
   a power rail contact plug, penetrating a partial thickness of the interlayer dielectric layer at a top of the power rail line, wherein the power rail contact plug covers all upper ends of the power rail line in the longitudinal direction; and
   a source/drain contact layer, located in the interlayer dielectric layer at a top of the source/drain doped region and in contact with the source/drain doped region, wherein the source/drain contact layer is located on the power rail contact plug and covers a top surface of the power rail contact plug, and on a projection surface parallel to the substrate, the source/drain contact layer extends across the power rail line;
   a division layer, penetrating the source/drain contact layer located between the power rail contact plug and an adjacent channel structure, wherein the division layer divides the source/drain contact layer in the longitudinal direction.

2. The semiconductor structure according to claim 1, wherein the source/drain contact layer and the power rail contact plug are an intergrated structure.

3. The semiconductor structure according to claim 1, wherein a width of the division layer in the longitudinal direction is 5 nm to 30 nm.

4. The semiconductor structure according to claim 1, further comprising:
   an isolation structure, located on the substrate and covering a part of a side wall of the channel structure, wherein the power rail line is located in the substrate in the power rail region and the isolation structure.

5. The semiconductor structure according to claim 4, wherein:
   the top surface of the power rail line is lower than a top surface of the isolation structure;

the semiconductor structure further comprises: a covering dielectric layer, located in the isolation structure and covering the top of the power rail line; and the power rail contact plug penetrates the covering dielectric layer and interlayer dielectric layer that are at the top of the power rail ine.

6. The semiconductor structure according to claim 1, wherein:

the channel structure is a fin, and the gate structure extends across the fin and covers a part of a top of the fin.

\* \* \* \* \*